United States Patent
Horii et al.

(10) Patent No.: US 7,037,749 B2
(45) Date of Patent: May 2, 2006

(54) METHODS FOR FORMING PHASE CHANGEABLE MEMORY DEVICES

(75) Inventors: Hideki Horii, Seoul (KR); Suk-Ho Joo, Seoul (KR); Ji-Hye Yi, Gyeonggi-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/780,246

(22) Filed: Feb. 18, 2004

(65) Prior Publication Data

US 2004/0183107 A1 Sep. 23, 2004

(30) Foreign Application Priority Data

Mar. 21, 2003 (KR) .................. 10-2003-0017694

(51) Int. Cl.
*H01L 21/00* (2006.01)
*H01L 51/40* (2006.01)
(52) U.S. Cl. .................. 438/95; 438/96; 438/99
(58) Field of Classification Search ........... 438/95, 438/96, 99
See application file for complete search history.

(56) References Cited

U.S. PATENT DOCUMENTS

| | | | |
|---|---|---|---|
| 5,177,567 A * | 1/1993 | Klersy et al. ............. 257/4 |
| 5,933,365 A | 8/1999 | Klersy et al. |
| 6,236,059 B1 | 5/2001 | Wolstenholme et al. |
| 6,586,761 B1 * | 7/2003 | Lowrey ..................... 257/3 |
| 6,841,793 B1 * | 1/2005 | Lee ........................... 257/3 |
| 2003/0082908 A1 * | 5/2003 | Lowrey ................... 438/652 |
| 2004/0037179 A1 * | 2/2004 | Lee ........................ 369/47.1 |
| 2004/0085833 A1 * | 5/2004 | Hwang et al. ........... 365/200 |
| 2004/0113232 A1 * | 6/2004 | Johnson et al. ......... 257/529 |
| 2004/0166604 A1 * | 8/2004 | Ha et al. .................. 438/102 |

FOREIGN PATENT DOCUMENTS

| | | |
|---|---|---|
| JP | 04-045584 | 2/1992 |
| JP | 04-45585 | 2/1992 |

OTHER PUBLICATIONS

Korean Notice to File a Response/Amendment to the Examination Report for Korean Application No. 2003-17694 mailed on May 30, 2005.

* cited by examiner

Primary Examiner—Ngân V. Ngô
(74) Attorney, Agent, or Firm—Myers Bigel Sibley & Sajovec (57) ABSTRACT

A phase-changeable memory device may include a substrate, an insulating layer on the substrate, first and second electrodes, and a pattern of a phase-changeable material between the first and second electrodes. More particularly, the insulating layer may have a hole therein, and the first electrode may be in the hole in the insulating layer. Moreover, portions of the second electrode may extend beyond an edge of the pattern of phase-changeable material. Related methods are also discussed.

25 Claims, 7 Drawing Sheets

Fig. 1

(PRIOR ART)

Fig. 2

(PRIOR ART)

METHODS FOR FORMING PHASE CHANGEABLE MEMORY DEVICES

RELATED APPLICATIONS

The present application claims the benefit of priority from Korean Application No. P2003-17694 filed Mar. 21, 2003, the disclosure of which is hereby incorporated herein in its entirety by reference.

FIELD OF THE INVENTION

The present invention relates to memory devices and more particularly to phase-changeable memory devices and methods of fabricating the same.

BACKGROUND OF THE INVENTION

Semiconductor memory devices may be categorized as volatile memory devices and non-volatile memory devices depending on whether data can be conserved or not when a power supply is cut off. Dynamic random access memory (D-RAM) devices and static random access memory (S-RAM) devices are volatile memory devices, and flash memory devices are examples of non-volatile memory devices. Typical memory devices may indicate logic "0" or "1" according to the presence of stored charges.

A volatile D-RAM may require periodic refresh operations and relatively high capacity for storing charges. There have thus been efforts to improve memory cell capacitances of DRAM devices. For example, surfaces of memory cell capacitor electrodes may be increased to increase capacitance, but the increase of the capacitor electrode surface area may be an obstacle to improving device integration densities.

A conventional flash memory cell may include a gate insulating layer, a floating gate, a dielectric layer and a control gate that are sequentially stacked on a semiconductor substrate. Writing and/or erasing data in a flash memory cell may include tunneling electrons through a gate insulating layer, and an operating voltage higher than a power voltage may need to be provided. A flash memory device may require a booster circuit for applying a required voltage during write and/or erase operations.

Accordingly, new memory devices having non-volatile and random access characteristics and simple structures have been developed. An example of such a new memory device is a phase-changeable memory device. A phase-changeable memory device may use a phase changeable material that changes its crystalline structure depending on heat provided thereto. Conventionally, the phase-changeable material may be a chalcogen compound including germanium (Ge), antimony (Sb) and/or tellurium (Te) (i.e., GST or Ge—Sb—Te). Phase-changeable materials are also discussed in U.S. Pat. No. 5,933,365 (to Klersy et al., entitled "Memory Element With Energy Control Mechanism", issued Aug. 3, 1999), the disclosure of which is hereby incorporated herein in its entirety by reference.

When a current is applied to the phase-changeable material layer to heat the phase-changeable material, a crystal state of a predetermined portion of the GST may change depending on the amount and/or duration of the current provided. In this case, a crystalline state may have a relatively low resistance and an amorphous state may have a high resistance. The resistance may vary according to the state of crystal, such that logical information can be determined by detecting differences of the resistance.

If GST is heated up to a melting point (about 610° C.) by applying a relatively high current flux to the GST for a relatively short time (1–10 ns) and then quenched quickly in a short time (1 ns or less), the heated portion of the GST may take an amorphous state (i.e., a reset state). If GST is heated up to maintain a crystalline temperature (about 450° C.) lower than the melting point temperature by applying a relatively low current flux for a relatively long time (i.e., about 30–50 ns) and cooled down, the heated portion of GST may take a crystalline state (a set state). The current flux for programming is thus related to a structure of the phase-changeable memory cell.

Figure 1:
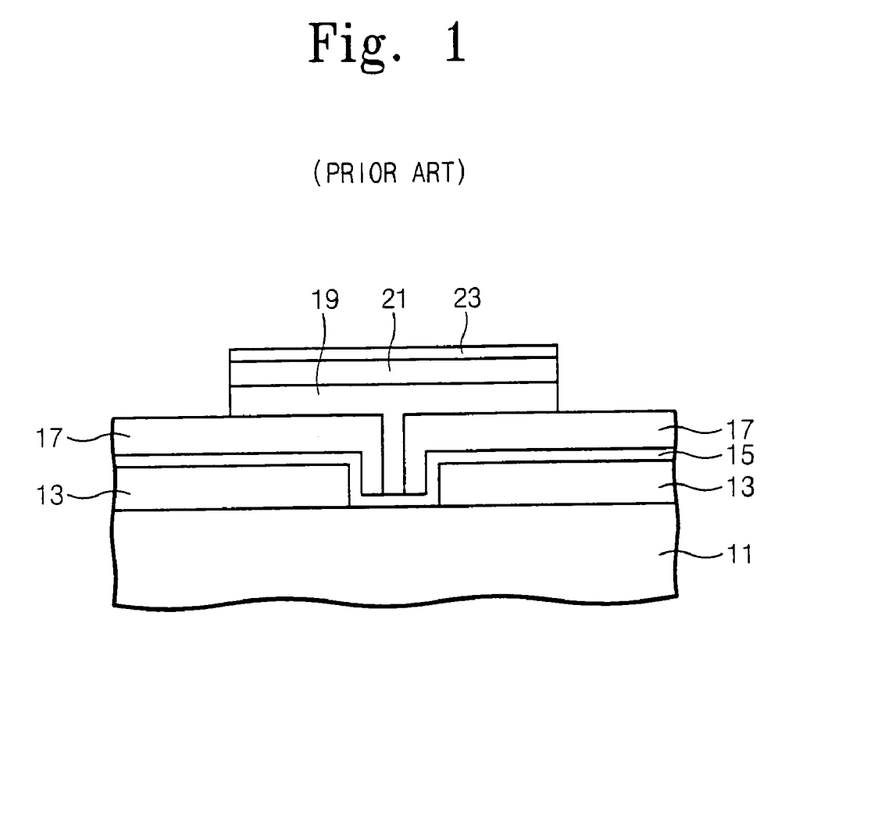
FIGS. 1 and 2 are cross-sectional views illustrating conventional phase-changeable memory devices.

FIG. 1 is a cross-sectional view showing a phase-changeable memory cell disclosed in U.S. Pat. No. 5,933,365. In FIG. 1, reference numbers 11 and 17 indicate insulating layers, reference numbers 13 and 23 indicate electrical contact layers, reference number 19 indicates a phase-changeable layer, and reference numbers 15 and 21 indicate heating layers for providing heat for the phase-changeable layer. As illustrated in FIG. 1, a small hole is formed in the insulating layer 17 to expose the heating layer 15. The phase-changeable layer 19 and the heating layer 15 are in contact with each other through the small hole. Accordingly, when heat is applied to the phase-changeable material layer 19 through the heating layer 15, a crystalline state of a portion of the phase-changeable layer contacting the heating layer 15 in the hole may change. That is, a crystalline state of the phase-changeable layer at a contacting area between the heating layer 15 and the phase-changeable layer 19 may change.

In the structure discussed above, heat provided for the phase-changeable layer 19 through the heating layer 15 may also diffuse through the heating layer 15, because the heating layer 15 has a widely spreading plate-shape. Current flux for programming may thus become high.

Figure 2:
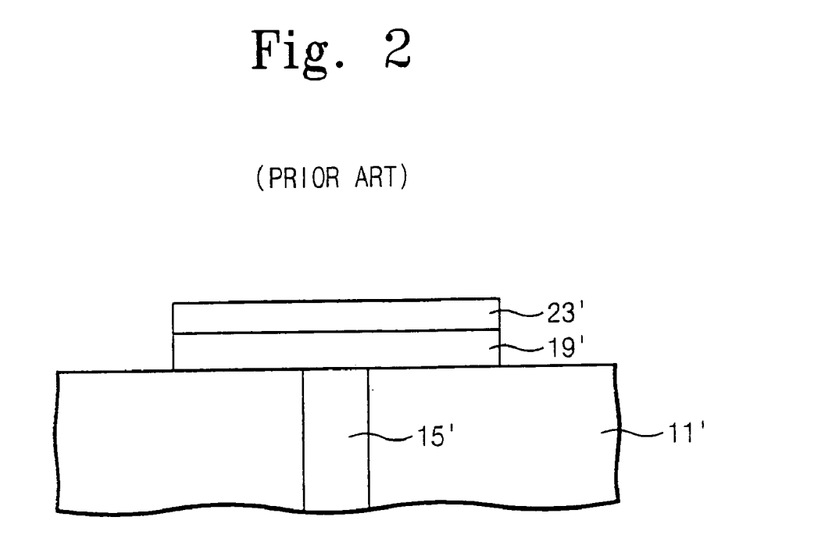

Accordingly, the heating layer may be provided in a plug-shape penetrating an insulating layer to reduce heat diffusion. FIG. 2 is a cross sectional view showing a phase-changeable memory device with the plug-shaped heating layer. In FIG. 2, reference number 11' indicates an insulating layer, reference number 15' indicates a plug-shaped lower electrode for heating a phase-changeable layer, reference number 19' indicates a phase-changeable layer, and reference number 23' indicates a second electrode.

Referring to FIG. 2, a plug-shaped lower electrode 15' provides heat for a phase-changeable layer 19' different from the plate-shaped heating layer 15 illustrated in FIG. 1. An intensity of the current provided to the phase-changeable layer 19' by the plug-shaped lower electrode 15' may increase and heat diffusion may decrease as compared with a plate-shaped heating layer. In the plug-shaped lower electrode structure, however, the phase-changeable layer 19' and the second electrode 23' may have a same diameter as was the case in the phase-changeable memory device of FIG. 1. Therefore, a relatively high program currently may still be required.

SUMMARY OF THE INVENTION

According to embodiments of the present invention, a phase-changeable memory device may include a substrate, an insulating layer, first and second electrodes, and a pattern of a phase-changeable material. More particularly, the insulating layer may be provided on the substrate, and the insulating layer may have a hole therein. The first electrode may be in the hole in the insulating layer, and the pattern of the phase-changeable layer may be on the first electrode between the first and second electrodes. Moreover, portions of the second electrode may extend beyond an edge of the pattern of phase-changeable material.

More particularly, a void may be defined between the portions of the second electrode extending beyond the edge of the pattern of the phase-changeable material and the first insulating layer. In addition, the pattern of the phase-changeable material may extend beyond the first electrode onto portions of the first insulating layer. In an alternative, the first insulating layer may be free of the phase-changeable material.

The phase-changeable memory device may also include a protective insulating layer on sidewalls of the pattern of phase-changeable material, on exposed surfaces of the second insulating layer, and on the first insulating layer. In addition, a second insulating layer may be provided on the protective insulating layer so that the protective insulating layer is between the second insulating layer and the second electrode and so that the protective insulating layer is between the second insulating layer and the first insulating layer. With the protective insulating layer and the second insulating layer, a void may be defined between the portions of the second electrode extending beyond the edge of the phase-changeable material and the first insulating layer.

According to additional embodiments of the present invention, a method of forming a phase-changeable memory device may include forming an insulating layer on a substrate wherein the insulating layer has a hole therein. A first electrode may be formed in the hole in the insulating layer, and a pattern of a phase-changeable material may be formed on the first electrode. A second electrode may be formed on the layer of the phase-changeable material such that the pattern of the phase-changeable material is between the first and second electrodes. Moreover, portions of the second electrode may extend beyond an edge of the pattern of phase-changeable material.

More particularly, forming the pattern of phase-changeable material and forming the second electrode may include forming a layer of the phase-changeable material on the first electrode and on the first insulating layer and forming a layer of an electrode material on the layer of the phase-changeable material. After forming the layers of the phase-changeable material and the electrode material, the layers of the phase-changeable material and the electrode material may be patterned to provide the pattern of the phase-changeable material and the second electrode. Moreover, the layer of the phase-changeable material may be over etched with respect to the layer of the electrode material so that the portions of the second electrode extend beyond the edge of the pattern of phase-changeable material.

In addition, patterning the layers of the phase-changeable material and the electrode material may include forming an etch mask on the layer of the electrode material. Portions of the layer of the electrode material exposed by the etch mask may be etched to provide the second electrode, and the layer of the phase-changeable material may be etched using the etch mask and/or the second electrode as a mask. The mask may then be removed.

More particularly, an etch gas including $CF_4$ may be used when etching portions of the layer of the electrode material, and an etch gas including $CF_4$ may be used when etching the layer of the phase-changeable material wherein a flux of the $CF_4$ decreases as etching the layer of the phase-changeable material progresses. Moreover, the etch gasses for etching the layer of the electrode material and for etching the layer of the phase-changeable material may include Ar and $Cl_2$. In an alternative, an etch gas including $CF_4$, Ar, and $Cl_2$ may be used when etching portions of the layer of the electrode material, and an etch gas including Ar, and $Cl_2$ without $CF_4$ may be used when etching portions of the phase-changeable material.

DETAILED DESCRIPTION

The present invention will now be described more fully hereinafter with reference to the accompanying drawings, in which embodiments of the present invention are shown. This invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, the thickness of layers and regions are exaggerated for clarity. Like numbers refer to like elements. It will also be understood that when a layer is referred to as being on another layer of substrate, it can be directly on the other layer or substrate, or intervening layers may also be present.

According to embodiments of the present invention, a phase-changeable device may include a transistor and a variable resistor for storing information. The variable resistor may include a pattern of a phase-changeable material and two electrodes for transferring an electrical signal to the pattern of the phase changeable material. A first of the two electrodes (i.e., a lower electrode) may be shaped like a plug penetrating an insulating layer. Depending on an intensity of current flowing through the first electrode, a crystalline structure of portions of the phase-changeable material in contact with the first electrode may change. The second of the two electrodes (i.e., a second electrode) may be disposed on the pattern of the phase changeable material and may be larger than the pattern of the phase changeable material. That is, the pattern of the phase changeable material may be smaller than the second electrode. Moreover, the second electrode may be formed to have a dimension as small as possible according to the photolithography technique being used. The pattern of the phase changeable material may thus be formed having a dimension smaller than that provided by the resolution of the photolithography technique being used. Program currents may thus be reduced.

Figure 3A:
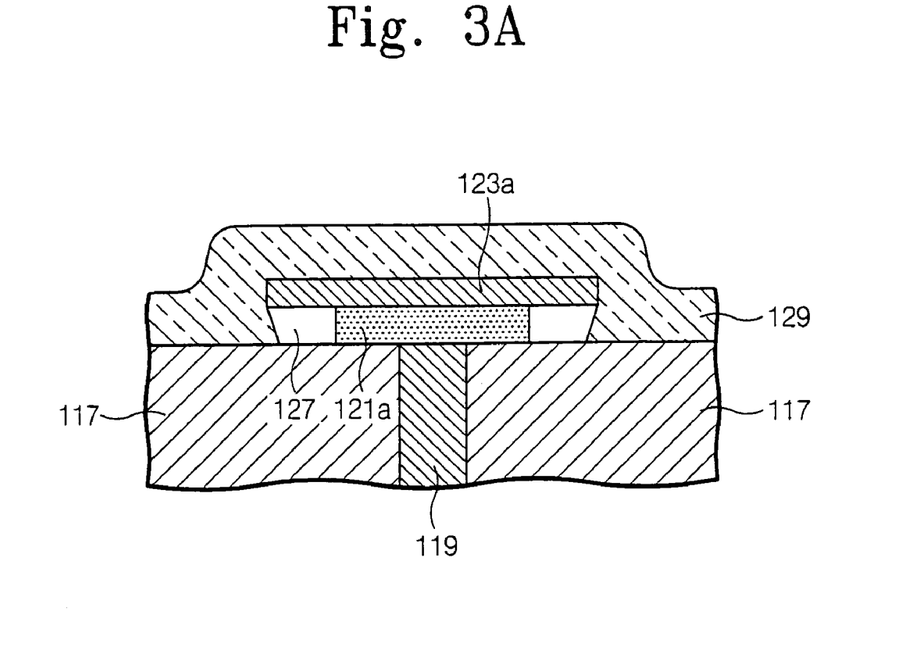
FIG. 3A is a cross-sectional view illustrating phase-changeable memory devices in accordance with embodiments of the present invention.

FIG. 3A is a cross-sectional view showing a variable resistor in accordance with embodiments of the present invention. In FIG. 3A, reference number 119 indicates a first electrode (such as a lower electrode) and reference number 121a indicates a pattern of a phase-changeable material. Reference numbers 117 and 129 refer to first insulating and second insulating layers, respectively. The first electrode 119 is plug-shaped penetrating a predetermined region of the first insulating layer 117. The pattern of the phase changeable material 121a is disposed on the first insulating layer 117 and/or the first electrode 119, and the pattern of the phase changeable material 121a is electrically connected to the first electrode 119. The second electrode 123a is disposed on the pattern of the phase changeable material 121a. A dimension of the pattern of the phase changeable material 121a may be smaller than a corresponding dimension of the second electrode. More particularly, the pattern of the phase changeable material 121a may be smaller than the second electrode 123a in diameter. The pattern of the phase changeable material 121a may have a dimension larger than a corresponding dimension of the contact-plug shaped first electrode 119. More particularly, the pattern of the phase changeable material 121a may be larger than the contact-plug shaped first electrode 119. The second electrode 123a may have various diameters but may be formed as small as allowed by a photolithographic process being used for integrity. The pattern of the phase changeable material may thus be formed to have a dimension(s) smaller than that allowed by the photolithographic process being used. As a result, program currents may be reduced.

The first electrode 119 and/or the second electrode 123a may comprise a conductive material including nitrogen, carbon, titanium, tungsten, molybdenum, tantalum, titanium silicide, tantalum and/or silicide, and/or combinations thereof. For example, a conductive material including nitrogen may be selected from titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxide nitride (TiON), titanium aluminum oxide nitride (TiAlON), tungsten oxide nitride (WON), and/or tantalum oxide nitride (TaON).

The pattern of the phase changeable material 121a may include a combination of at least one of Te and/or Se, and at least one of Ge, Sb, Bi, Pb, Sn, Ag, As, S, Si, P, O and/or N. For example, the pattern of the phase changeable material may include Ge—Sb—Te, As—Sb—Te, As—Ge—Sb—Te, Sn—Sb—Te, Ag—In—Sb—Te, In—Sb—Te, 5A group elements-Sb—Te, 6A group elements-Sb—Te, 5A group elements-Sb—Se, and/or 6A group elements-Sb—Se.

The second insulating layer 129 may cover the second electrode 123a and the first insulating layer 117 outside the second electrode 123a, such that an undercut space 127 is provided adjacent portions of the second electrode 123a not in contact with the top surface of the pattern of the phase changeable material 121a. The undercut space 127 surrounding the pattern of the phase changeable material 121a may provide adiabatic properties to reduce loss of heat provided from the first electrode 119 to the pattern of the phase changeable material 121a during a program operation. Therefore, the heat may be effectively conducted from the first electrode 119 to the pattern of the phase changeable material 121a so that program current can be reduced.

Figure 3B:
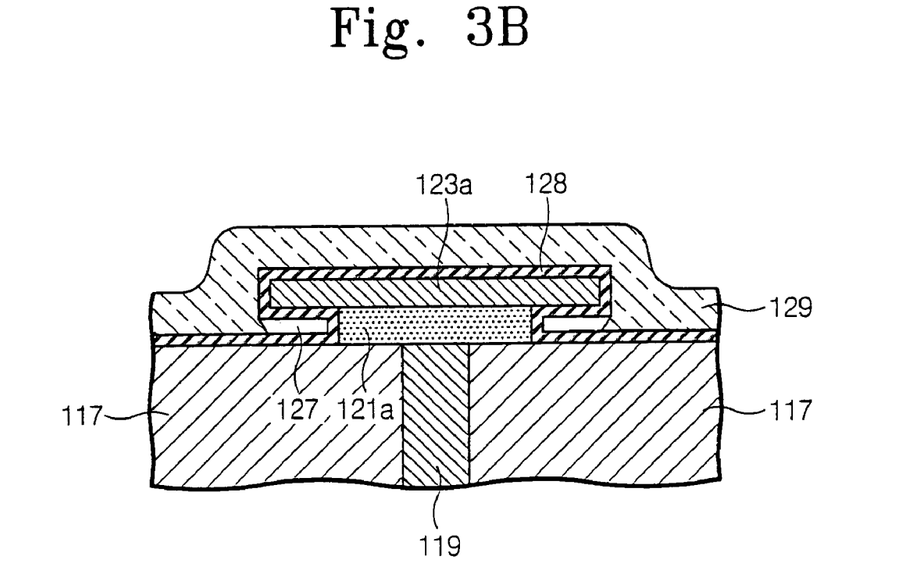
FIG. 3B is a cross-sectional view illustrating phase-changeable memory devices in accordance with additional embodiments of the present invention.

The first electrode 119 may be electrically connected to a source region of a transistor formed on a substrate (not illustrated in FIG. 3A). The second electrode 123a may be electrically connected to a data line disposed on the second insulating layer 129. As illustrated in FIG. 3B, a protective insulating layer 128 may be formed (prior to forming the second insulating layer 129) along exposed portions of the first insulating layer 117, the pattern of the phase changeable material 121a, and the second electrode 123a.

The protective insulating layer 128 and the second insulating layer 129 may include one or more materials selected from silicon dioxide ($SiO_2$), silicon nitride ($SiN_x$), silicon oxide nitride (SiON), aluminum oxide ($AlO_x$), titanium oxide ($TiO_2$), tantalum oxide ($Ta_2O_5$), and/or hafnium oxide ($HfO_2$), and/or combinations thereof. The protective insulating layer 128 may be formed to have uniform thickness along the structure. More particularly the layer 128 may be formed using a thin film deposition technology providing relatively good step coverage, such as atomic layer deposition (ALD), chemical vapor deposition (CVD), etc. The second insulating layer 129 may be formed by a thin film deposition technology providing relatively poor step coverage, such as plasma vapor deposition (PVD), plasma enhanced chemical vapor deposition (PE-DVD), etc.

Figure 4A:
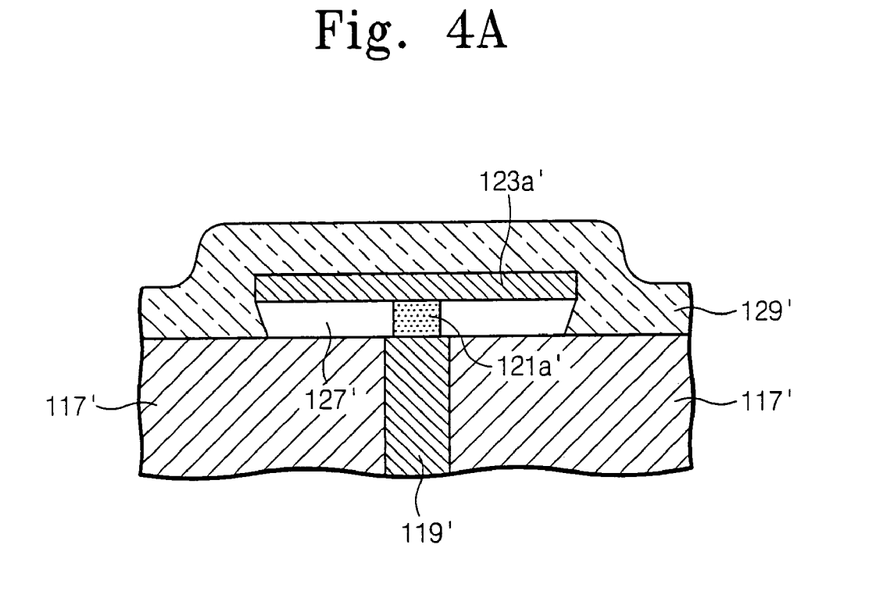
FIG. 4A is a cross-sectional view illustrating phase-changeable memory devices in accordance with yet additional embodiments of the present invention.

FIG. 4A is a cross-sectional view illustrating a variable resistor in accordance with other embodiments of the present invention. The structure of FIG. 4A includes first insulating layer 117', first electrode 119', pattern of the phase changeable material 121a', second electrode 123a, and second insulating layer 129'. Referring to FIG. 4A, the variable resistor is similar to that illustrated in FIG. 3A except that the pattern of the phase changeable material 121a' has a dimension smaller than that of a corresponding dimension of the first electrode 119'. Thus, an undercut space 127' surrounding the pattern of the phase changeable material 121a' may be a little wider than that illustrated in FIG. 3A. The pattern of the phase changeable material 121a' has a dimension smaller than that of a corresponding dimension of the second electrode 123a'. A diameter of a contact region between the pattern of the phase changeable material 121a' and the first electrode 119' may be smaller than that of the pattern of the phase changeable material 121a' illustrated in FIG. 3A. However, the diameter of the pattern of the phase changeable material 121a' may be equal to that of the first electrode 119 of FIG. 3A. In this case, the diameter of first electrode 119' may be larger than the diameter 119 of the first electrode in FIG. 3A, and the contact region between the first electrode and the pattern of the phase changeable material may be identical to that in FIG. 3A.

Figure 4B:
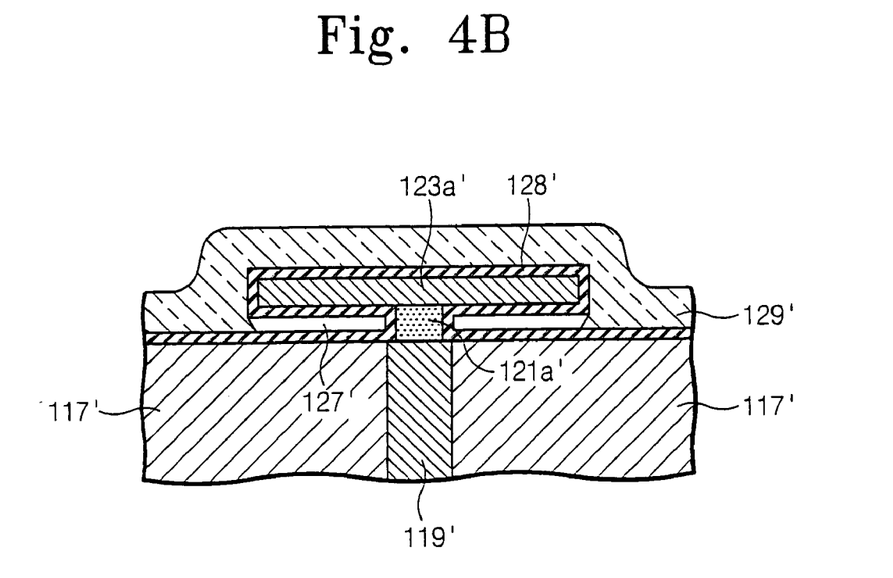
FIG. 4B is a cross-sectional view illustrating phase-changeable memory devices in accordance with still additional embodiments of the present invention.

As shown in FIG. 4B, a protective layer 128' having uniform thickness may be disposed along the first insulating layer 117', the pattern of the phase changeable material 121' and the second electrode 123a'.

Methods of fabricating phase-changeable memory devices including variable resistors according to embodiments of the present invention are discussed with reference to FIGS. 5–11.

Figure 5:
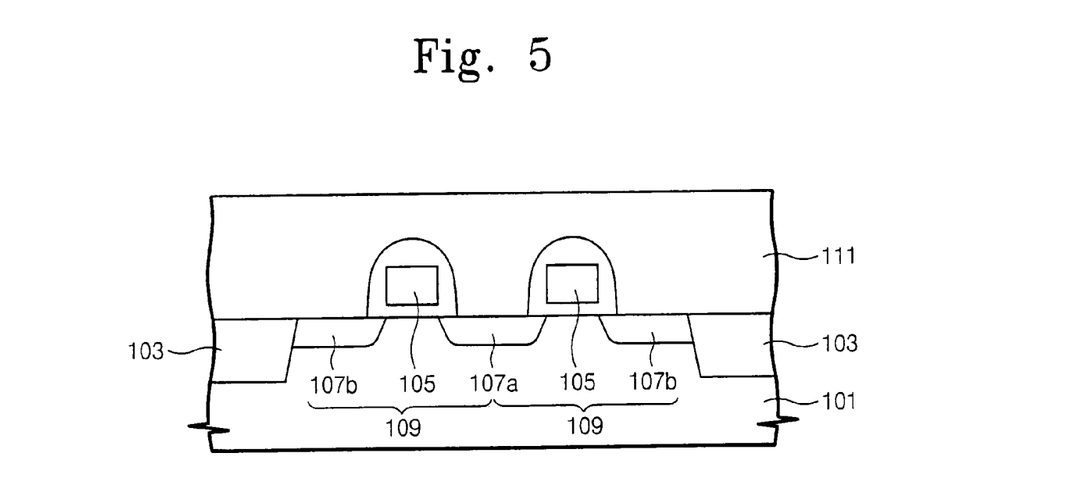
FIGS. 5 through 11 are cross-sectional views illustrating steps for fabricating phase-changeable memory devices in accordance with embodiments of the present invention.

Referring to FIG. 5, a conventional MOS field effect transistor process can be used to form a device isolating region 103 and transistors 109 on a substrate 101. The device isolating region 103 may be formed in a substrate 101 and may define active regions. The device isolating region 103 may be formed, for example, using a local oxidation of silicon (LOCOS) isolation process and/or a shallow trench isolation (STI) process. The transistors 109 may include respective gate electrodes 105, respective source regions 107b, and a common drain region 107a. The gate electrodes 105 may be formed on the substrate 101 and may extend in a direction perpendicular to the cross-section of FIG. 5. The source regions 107b and the common drain region 107a are formed in the substrate 101. Portions of the active region between the source and drain regions 107b and 107a may provide a current pass channel therebetween. A gate insulating layer is provided between the gate electrodes 105 and the channel regions.

An interlayer insulating layer 111 may be formed or the substrate including the transistors 109. The interlayer insulating layer 111 may be formed, for example, of silicon oxide using chemical vapor deposition (CVD).

Figure 6:
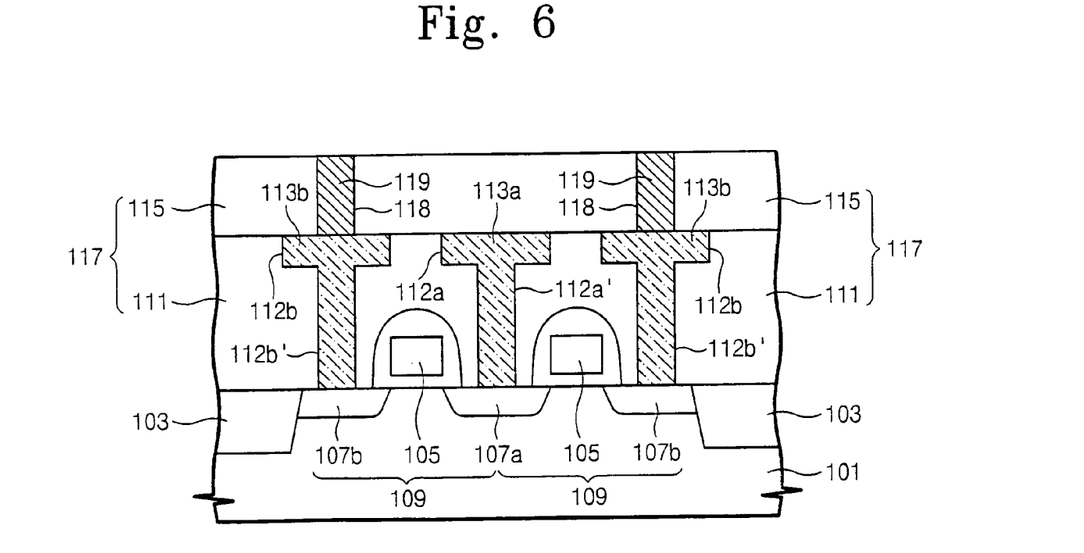

Referring to FIG. 6, interconnection 113a and electrode forming processes are explained. The interconnection 113a is a conductive interconnection electrically connected to the common drain region 107a of the transistors 109. For example, the interconnection may extend parallel to the gate electrodes 105. The interconnection 113a may be formed using a dual damascene process. More particularly, the interlayer insulating layer 111 may be patterned to form an interconnection groove 112a and a contact hole 112a'. The interconnection groove 112a and the contact hole 112a' may be filled with conductive material to form interconnection 113a. Contact pads 113b can be formed electrically connected to the source regions 107b when the interconnection 113a is formed. Openings 112b for the contact pads and the contact holes 112b' can be formed when the interconnection groove 112a and the contact hole 112a' are formed. In addition, while the interconnection groove 112a and the contact hole 112a' are filled with a conductive material, the openings 112b and the contact holes 112a' can also be filled with the conductive material. The contact pads 113b may provide electrical connection between first electrodes 119 (formed in a subsequent process) and the source regions 107b.

The dual damascene process may be replaced by other methods for forming the interconnection 113a and the contact pads 113b. That is, the interlayer insulating layer 111 may be patterned to form contact holes exposing the source and drain regions 107b and 107a. Then, a conductive material may be formed on the first interlayer insulating layer 111 to fill the contact holes. A patterning process may be further carried out.

An interlayer insulating layer 115 may be formed on the interconnection 113a, the contact pads 113b, and the interlayer insulating layer 111. The interlayer insulating layer 111 and the interlayer insulating layer 115 may provide a combined insulating layer 117. The interlayer insulating layer 115 may be formed, for example, of silicon oxide by a chemical vapor deposition. The interlayer insulating layer 115 may be patterned to form contact holes 118 exposing the contact pads 113b. Then, the contact holes 118 can be filled with conductive material to form first electrodes 119 electrically connected to the contact pads 113b. The first electrodes 119 may be formed by depositing a conductive material and planarizing the conductive material to provide plugs even with a surface of insulating layer 115 (e.g., a chemical mechanical polishing or etch back process). Optionally, insulating spacers may be formed on sidewalls of the contact hole 118 to decrease a diameter of the first electrodes 119.

The first electrodes 119 may be formed of a conductive material including nitrogen, carbon, titanium, tungsten, molybdenum, tantalum, titanium silicide, tantalum, and/or silicide, and/or combinations thereof. The first electrode layers 119 may be formed, for example, by material layer deposition methods such as chemical vapor deposition (CVD), plasma enhanced chemical vapor deposition (PE-CVD), and/or atomic layer deposition (ALD).

For example, the conductive material may be a conductive material including nitrogen such as titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxide nitride (TiON), titanium aluminum oxide nitride (TiAlON), tungsten oxide nitride (WON) and/or tantalum oxide nitride (TaON).

The first electrode 119, for example, may be formed of titanium aluminum nitride. A source gas such as titanium tetrachloride (TiCl$_4$) may flow into a reactor to be absorbed on the semiconductor substrate with the contact holes 118. The non-absorbed TiCl$_4$ gas may be purged by a purging gas and then a nitrogen source such as ammonia (NH$_3$) gas may flow into the reactor. Titanium nitride (TiN) electrodes may thus be formed. The purging gas may purge the inside of the reactor, and the non-reacted ammonia may flow out from the reactor. Aluminum trimethane (Al(CH$_3$)$_3$) may flow into the reactor as an aluminum source and may be absorbed on the titanium layer. Non-absorbed aluminum trimethane may flow out from the reactor with the purging gas. Again, ammonia may flow into the reactor, and the ammonia may then be purged by the purging gas. A cycle comprising these steps may be repeated to form a TiAlN layer having a desirable thickness. A carrier gas (such as argon and/or nitrogen gas) may be used as a source gas to provide smooth flow into smoothly.

Figure 7:
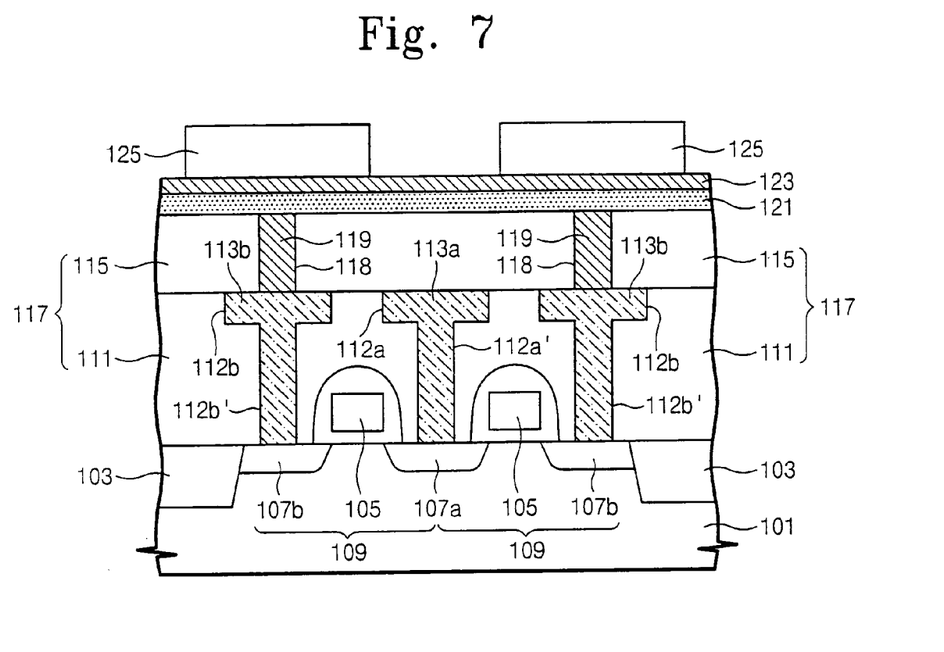

Referring to FIG. 7, after the first electrode 119 is formed, a layer of a phase-changeable material 121 and a second electrode layer 123 may be formed on the combined insulating layer 117. The layer of the phase-changeable material 121 may include a combination of at least one of Te and/or Se (i.e., chalcogens), and at least one of Ge, Sb, Bi, Pb, Sn, Ag, As, S, Si, P, O, and/or N. For example, the phase-changeable material may include Ge—Sb—Te, As—Sb—Te, As—Ge—Sb—Te, Sn—Sb—Te, Ag—In—Sb—Te, In—Sb—Te, 5A group elements-Sb—Te, 6A group elements-Sb—Te, 5A group elements-Sb—Se, and/or 6A group elements-Sb—Se.

The layer of the phase-changeable material 121 may be formed, for example, by sputtering Ge—Sb—Te. Using a Ge—Sb—Te, sputtering target, a layer of a phase-changeable material 121 may be formed having a thickness in the range of about 100–1,000 Å under a condition of about 10 mm Torr argon and about 500 W DC power.

The second electrode layer 123 may be formed for example, by CVD, PVD, and/or ALD of the same material as the first electrode 119. For example the second electrode 123 may be formed of a conductive material including nitrogen, carbon, titanium, tungsten, molybdenum, tantalum, titanium silicide, tantalum, and/or silicide, and/or combinations thereof.

The second electrode layer, for example, may be formed of titanium aluminum nitride using PE-CVD. Using DC sputtering with a titanium aluminum alloy target (aluminum of 20 atomic percent), the second electrode layer 123 may be formed having a thickness in the range of about 100–1,000 Å under conditions of about 3 mm Torr argon, about 3 mm Torr nitrogen and about 1500 W DC power. Referring to FIG. 7, a photoresist pattern 125 may be formed on the second electrode layer 123 to define the second electrode.

Figure 8:
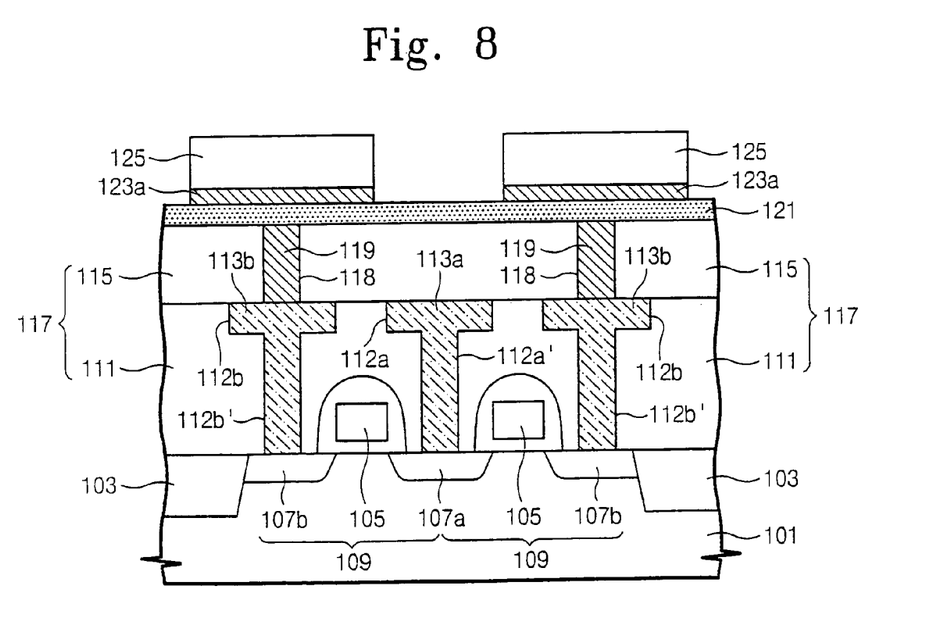

Referring to FIG. 8, the exposed second electrode layer 123 is etched to form second electrodes 123a using the photo resist pattern 125 as an etch mask. The etching of the second electrode layer 123 may use an etch gas including at least $CF_4$ gas. More particularly, the etching of the second electrode layer 123 may use an etch gas including $CF_4$, Ar and $Cl_2$.

Figure 9:
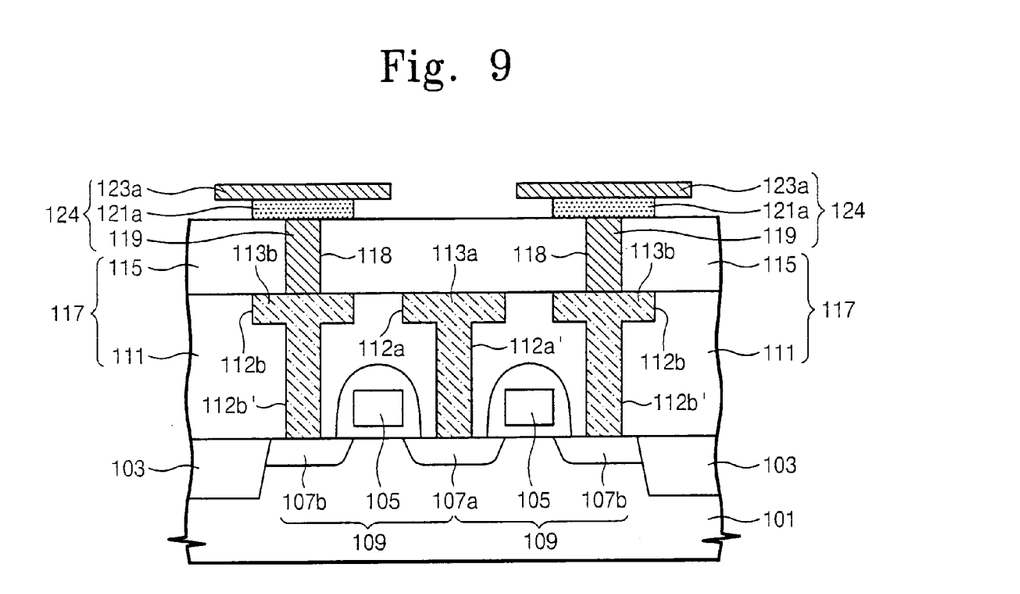

Exposed portions of the layer of the phase-changeable material 121 may be etched to form a pattern of the phase-changeable material 121a as illustrated in FIG. 9. The first electrodes 119, the pattern of the phase-changeable material 121a, and the second electrodes 123a may provide variable resistances 124. The layer of the phase-changeable material and the second electrode layer may be etched using a same etch chamber. Flux of the $CF_4$ gas may be gradually reduced when the layer of the phase-changeable material is etched after the second electrode layer is etched. Thus, a pattern of a phase-changeable material 121a may be formed with a dimension smaller than that of the second electrode 123a. Alternatively, the flux of the $CF_4$ may be reduced compared to what is used during etching of the second electrode layer.

In another alternative, the $CF_4$ may not be used when etching the layer of the phase-changeable material 121. That is, when the second electrode layer 123 is etched, $CF_4$, Ar and $Cl_2$ gases may be used, and when the layer of the phase-changeable material 121 is etched, Ar and $Cl_2$ gases may be used without $CF_4$.

Depending on a flux of the $CF_4$ gas, the pattern of the phase-changeable material 121a may be formed having different sizes. For example, relatively small amounts of $CF_4$ may result in pattern of the phase changeable materials 121a having smaller dimensions. Thus, controlling the flux of the $CF_4$ may make it possible to form the pattern of the phase changeable material 121a having a desired size. The pattern of the phase changeable material 121a can be formed smaller than the second electrode 123a and larger than the first electrode 119 as illustrated in FIG. 3A. In an alternative, the pattern of the phase changeable material 121a' can be formed smaller than the second and first electrodes 123a and 119.

Figure 10:
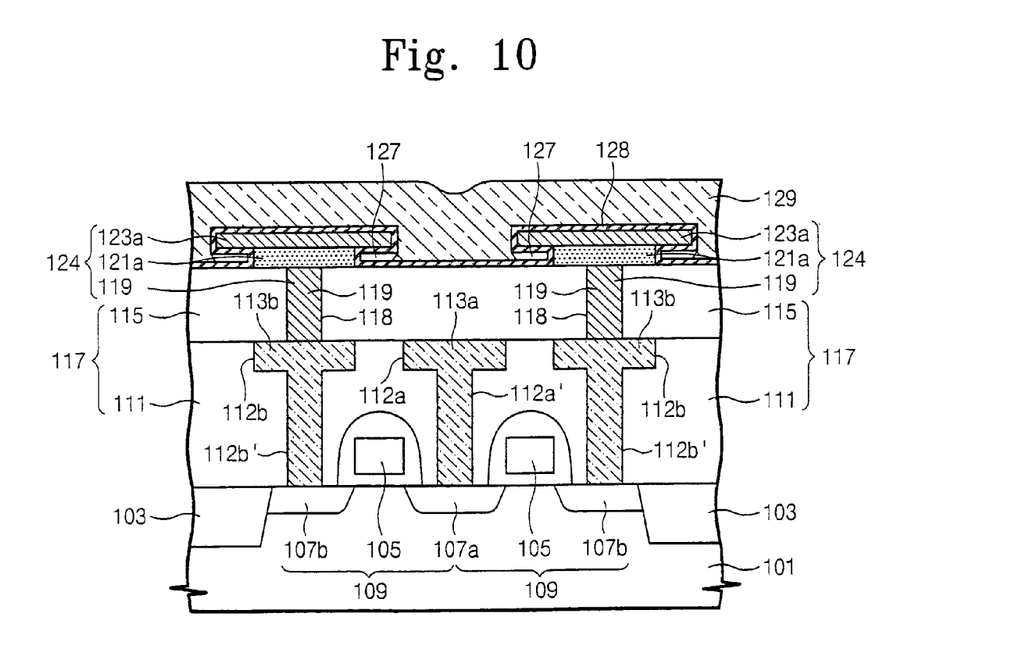

Subsequent steps are discussed with reference to FIGS. 10 and 11. Referring to FIG. 10, an insulating layer 129 is formed on the insulating layer 117 to cover at least the second electrodes 123a.

The insulating layer 129 may be formed, for example, using plasma vapor deposition, and/or plasma enhanced chemical vapor deposition. That is, the insulating layer 129 may be formed on a top surface and sidewalls of the second electrodes 123a and on the insulating layer 117 outside the second electrodes 124a such that an undercut space 127 (referring to FIG. 3A) is provided adjacent portions of the second electrode 123a that are not in contact with the top surface of the pattern of the phase changeable material 121a. The undercut space 127 may surround sidewalls of the pattern of the phase changeable material. In addition, the undercut space 127 may provide improved adiabatic characteristics to reduce a loss of heat provided to the pattern of the phase changeable material 121a. For example, the insulating layer 129 may be formed of plasma-enhanced TEOS (PE-TEOS).

In an alternative, the undercut space may be filled with the insulating layer 129. That is, the second insulating layer may be formed using atomic layer deposition and/or chemical vapor deposition, which provide relatively good step coverage.

In addition, a protective insulating layer 128 may also be formed for example using atomic layer deposition, and/or chemical vapor deposition before forming the insulating layer 129, which may have relatively poor step coverage. The protective layer 128 may be formed to have a relatively uniform thickness along the insulating layer 117, sidewalls of the pattern of the phase changeable material 121a, and the second electrode 123a. In this case, the insulating layer 129 may be formed on the protective insulating layer 128, and a vacant space 127 may be maintained beside the pattern of the phase changeable material 121a.

The insulating layer 129 may be formed of silicon dioxide ($SiO_2$), silicon nitride ($SiN_x$), silicon oxide nitride (SiON), aluminum oxide ($AlO_x$), titanium oxide ($TiO_2$), tantalum oxide ($Ta_2O_5$), and/or hafnium oxide ($HfO_2$), and/or combinations thereof.

The protective insulating layer 128 may also be formed of silicon dioxide ($SiO_2$), silicon nitride ($SiN_x$), silicon oxide nitride (SiON), aluminum oxide ($AlO_x$), titanium oxide ($TiO_2$), tantalum oxide ($Ta_2O_5$), and/or hafnium oxide ($HfO_2$), and/or combinations thereof.

Figure 11:
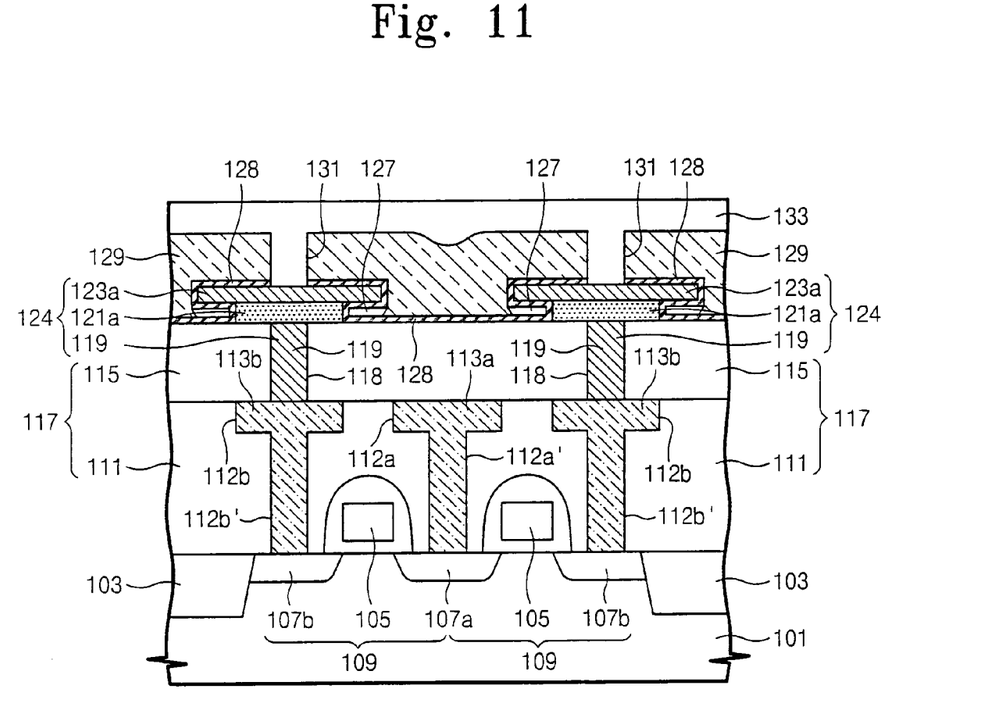

Referring to FIG. 11, the insulating layer 129 may be patterned to form a via holes 131 exposing portions of the second electrodes 123a. A conductive material may be deposited in the via holes 131 and on the second insulating layer 129, and the conductive material may then be patterned to form an interconnection 133.

For example, the interconnection 133 may be formed of aluminum, aluminum-copper alloy, aluminum-copper-silicon alloy, tungsten silicide, titanium, tungsten, molybdenum, tantalum, tungsten titanium, and/or copper. In addition, the second interconnection may be formed, for example, using plasma vapor deposition, and/or chemical vapor deposition.

Alternatively, conductive plugs may be formed to fill in the via holes 131, and then a conductive material may be deposited again and patterned to form the interconnection 133.

Inventors of the present invention measured temperatures of the pattern of the phase changeable material in different structured phase-changeable memory devices when an identical current pulse was applied thereto. The results were simulated in two cases. One case is that the second electrode and the phase-changeable pattern are the same in size, corresponding to the conventional structure, and the second case is that the layer of the phase changeable material of the present invention is smaller than the second electrode.

In the first case, the second electrode and the pattern of the phase changeable material are both 100 nm in thickness and 240 nm in diameter. In the second case, the second electrode and the pattern of the phase changeable material are both 100 nm in thickness, the second electrode is 240 nm in diameter, and the pattern of the phase changeable material is 80 nm in diameter. The plug type first electrode is 80 nm in diameter and 100 nm in thickness in both cases.

The resistance of the pattern of the phase changeable material is 0.01Ω cm and about 1 mA program current is applied for 10 nsec.

According to a conventional structure, the maximum temperature rose up to approximately 605 K. This result is significantly lower than the melting temperature of 900 K for converting the phase-changeable material to an amorphous state (i.e., a reset state). Accordingly, the structure is not reset. However, the structure of the present invention (i.e., the second case) rose up to approximately 1689 K, such that the reset is possible.

According to embodiments of the present invention, a phase-changeable memory device may be capable of reducing program currents.

A phase-changeable memory device according to embodiments of the present invention may include a plug-type first electrode, a second electrode and a phase-changeable material pattern. The second electrode may be larger in diameter than the first electrode. The phase-changeable material pattern may be interposed between the first and second electrodes and may be smaller than the second electrode in diameter.

The second electrode may be formed as small as allowed using an available photolithographic technology. According to embodiments of the present invention, the phase-changeable material pattern may be formed smaller than a resolution of an available photolithography technology. The program current may thus be reduced because the program current may decrease as the size of the phase-changeable material pattern is reduced.

The phase-changeable material pattern may have any size if the size is smaller than the second electrode. The phase-changeable material pattern may be larger than the first electrode. Alternatively, the phase-changeable material pattern may be smaller than the first electrode or the same.

The phase-changeable material pattern may include a combination of at least one selected from Te and/or Se, and at least one selected from Ge, Sb, Bi, Pb, Sn, Ag, As, S, Si, P, O, and/or N. More specifically, the phase-changeable material pattern may include Ge—Sb—Te, As—Sb—Te, As—Ge,—Sb—Te, Sn—Sb—Te, Ag—In—Sb—Te, In—Sb—Te, 5A group elements-Sb—Te, 6A group elements-Sb—Te, 5A group elements-Sb—Se, and/or 6A group elements-Sb—Se, etc.

The first and second electrodes may be formed of one selected from a conductive material including nitrogen, carbon, titanium, tungsten, molybdenum, tantalum, titanium silicide, tantalum, and/or silicide, and/or combinations thereof. For example, a conductive material including nitrogen may be selected from titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxide nitride (TiON), titanium aluminum oxide nitride (TiAlON), tungsten oxide nitride (WON), and/or tantalum oxide nitride (TaON).

The first electrode may be formed penetrating a first insulting layer, and a second insulating layer may be disposed on the first insulating layer to cover at least the second electrode. A metal interconnection (i.e., a data line) may be formed on the second insulating layer and electrically connected to the second electrode through a contact hole penetrating the second insulating layer.

The second insulating layer may be disposed on a top surface and sidewalls of the second electrode and a top surface of the first insulating layer, such that an undercut space is formed under the second electrode that is not in contact with the top surface of the phase-changeable material pattern. That is, the undercut space may extend from the side of the phase-changeable material pattern to the side of the second electrode and may surround the phase-changeable material pattern. The undercut space may reduce spreading of heat provided to the phase-changeable material pattern outside the pattern of the phase-changeable material.

In addition, a protective insulating layer may be formed with a uniform thickness along an outline of a structure defined by the second electrode, the phase-changeable material pattern, the first electrode, and the first insulating layer. For example, the protective insulating layer may be formed of a material selected from silicon dioxide ($SiO_2$), silicon nitride ($SiN_x$), silicon oxide nitride (SiON), aluminum oxide ($AlO_x$), titanium oxide ($TiO_2$), tantalum oxide ($Ta_2O_5$), and/or hafnium oxide ($HfO_2$), and/or combinations thereof.

According to additional embodiments of the present invention, a phase-changeable memory device may include a substrate with a transistor having a source region, a drain region, and a gate. A lower insulating layer may be disposed on the substrate, and a lower electrode may penetrate the lower electrode layer and may be electrically connected to the source region. A phase-changeable material pattern may be disposed on at least a portion of the lower electrode, and an second electrode may be disposed on the phase-changeable memory pattern. An second insulating layer may be disposed on the lower insulating layer to cover the second electrode, and an second interconnection may be disposed on the second insulating layer. In this case, the second electrode may be larger than the phase-changeable pattern and the lower electrode, and the second interconnection may be electrically connected to the second electrode through a via hole penetrating the second insulating layer and exposing the second electrode.

According to still additional embodiments of the present-invention, a method of fabricating a phase-changeable memory device may include depositing a phase-changeable material layer and an second electrode layer and etching the layers to form an second electrode and a phase-changeable material pattern. The etching may use an etch gas including $CF_4$, but a flux of the $CF_4$ may be gradually reduced while the phase-changeable material layer is etched.

The etch gas may include Ar and $Cl_2$. More particularly, the etching of the second electrode layer may use a gas including $CF_4$, Ar and $Cl_2$, and the etching of the phase-changeable material layer may use a gas including Ar and $Cl_2$ without $CF_4$. The phase-changeable material pattern may thus be formed smaller than the second electrode. By controlling a flux of the $CF_4$, a phase-changeable material pattern can be formed that is smaller than-the second electrode.

According to yet additional embodiments of the present invention, a method for fabricating a phase-changeable memory device may include providing a substrate with a lower insulating layer, and forming a lower electrode penetrating the lower insulating layer. A phase-changeable material layer and an second electrode layer may be sequentially formed on the lower insulating layer and the second electrode, and the second electrode layer and the phase-changeable material layer may be patterned to form an second electrode and a phase-changeable material pattern. An second insulating layer may be formed on an entire surface of a resultant structure with the second electrode and the phase-changeable material pattern. In this case, the second electrode may be larger than the lower electrode in diameter, and the phase-changeable material pattern may be smaller than the second electrode and in contact with the lower electrode.

Forming the second electrode and the phase-changeable material pattern by successively patterning the second electrode layer and the phase-changeable material layer may include forming an etch mask pattern on the second electrode layer. Portions of the second electrode layer exposed by the etch mask pattern may be etched to form an second electrode. Exposed portions of the phase-changeable material layer may be etched to form a phase-changeable material pattern smaller than the second electrode in diameter. The etch mask pattern may then be removed. In this case, the etching of the first electrode layer may use an etch gas including $CF_4$. The etching of the phase-changeable material layer may use the same etch gas as the first etching but a flux of the $CF_4$ gas may be reduced while the second etching progresses. In addition, the first and second etchings may both include Ar and $Cl_2$.

The second insulating layer may be formed by a plasma vapor deposition and/or a plasma enhanced chemical vapor deposition. Moreover, the second insulating layer may be formed on a top surface and sidewalls of the second electrode and on the lower insulating layer. More particularly, an undercut space may be formed under the second electrode that is not in contact with the top surface of the phase-changeable material pattern.

Before forming the second insulating layer, a protective insulating layer may be formed with a uniform thickness along an outline of a structure defined by the second electrode, the phase-changeable material pattern, the lower electrode, and the lower insulating layer. The protective insulating layer may be formed of a material selected from silicon dioxide ($SiO_2$), silicon nitride ($SiN_x$), silicon oxide nitride (SiON), aluminum oxide ($AlO_x$), titanium oxide ($TiO_2$), tantalum oxide ($Ta_2O_5$), and/or hafnium oxide ($HfO_2$), and/or combinations thereof. Moreover, the protective insulating layer may be formed by atomic layer deposition and/or a thermal chemical vapor deposition.

The second insulting layer may be formed of silicon dioxide ($SiO_2$), silicon nitride ($SiN_x$), silicon oxide nitride (SiON), aluminum oxide ($AlO_x$), titanium oxide ($TiO_2$), tantalum oxide ($Ta_2O_5$), and/or hafnium oxide ($HfO_2$), and/or combinations thereof. Moreover, the second insulating layer may be formed by a plasma enhanced chemical vapor deposition.

While the present invention has been described by way of example and in terms of the particular embodiments, it is to be understood that the invention is not limited to the disclosed embodiments. To the contrary, it is intended to cover various modifications, and similar arrangements would be apparent to those skilled in the art. Therefore, the scope of the appended claims, which define the invention, should be accorded the broadest interpretation so as to encompass all such modifications and similar structures.

What is claimed is:

1. A method of forming a phase-changeable memory device comprising:
   forming an insulating layer on a substrate, the insulating layer having a hole therein;
   after forming the insulating layer, forming a first electrode in the hole in the insulating layer;
   forming a pattern of a phase-changeable material on the first electrode; and
   forming a second electrode on the layer of the phase-changeable material such that the pattern of the phase-changeable material is between the first and second electrodes, wherein portions of the second electrode extend beyond an edge of the pattern of phase-changeable material.

2. A method of forming a phase-changeable memory device comprising:
   forming an insulating layer on a substrate, the insulating layer having a hole therein;
   forming a first electrode in the hole in the insulating layer;
   forming a pattern of a phase-changeable material on the first electrode;
   forming a second electrode on the layer of the phase-changeable material such that the pattern of the phase-changeable material is between the first and second electrodes, wherein portions of the second electrode extend beyond an edge of the pattern of phase-changeable material;
   wherein forming the pattern of phase-changeable material and forming the second electrode comprise,
   forming a layer of the phase-changeable material on the first electrode and on the first insulating layer,
   forming a layer of an electrode material on the layer of the phase-changeable material, and
   after forming the layers of the phase-changeable material and the electrode material, patterning the layers of the phase-changeable material and the electrode material to provide the pattern of the phase-changeable material and the second electrode.

3. A method according to claim 2 wherein the patterning the layers of the phase-changeable material comprises over etching the layer of the phase-changeable material with respect to the layer of the electrode material so that the portions of the second electrode extend beyond the edge of the pattern of phase-changeable material.

4. A method according to claim 2 wherein patterning the layers of the phase-changeable material and the electrode material comprises forming an etch mask on the layer of the electrode material, etching portions of the layer of the electrode material exposed by the etch mask to provide the second electrode, etching the layer of the phase-changeable material using the etch mask and/or the second electrode as a mask, and removing the etch mask.

5. A method according to claim 4 wherein etching portions of the layer of the electrode material comprises etching using an etch gas including $CF_4$, wherein etching the layer of the phase-changeable material comprises etching using an etch gas including $CF_4$ wherein a flux of the $CF_4$ decreases as etching the layer of the phase-changeable material progresses.

6. A method according to claim 5 wherein the etch gasses for etching the layer of the electrode material and for etching the layer of the phase-changeable material include Ar and $Cl_2$.

7. A method according to claim 4 wherein etching portions of the layer of the electrode material comprises etching using an etch gas including $CF_4$, Ar, and $Cl_2$, and wherein etching portions of the layer of the phase-changeable material comprises etching using an etch gas including Ar, and $Cl_2$ without $CF_4$.

8. A method of forming a phase-changeable memory device comprising:
   forming an insulating layer on a substrate, the insulating layer having a hole therein;
   forming a first electrode in the hole in the insulating layer;
   forming a pattern of a phase-changeable material on the first electrode;
   forming a second electrode on the layer of the phase-changeable material such that the pattern of the phase-changeable material is between the first and second electrodes, wherein portions of the second electrode extend beyond an edge of the pattern of phase-changeable material; and
   forming a second insulating layer on the second electrode and on the insulating layer, wherein the second electrode is between the second insulating layer and the pattern of phase-changeable material and wherein a void is defined between the portions of the second electrode extending beyond the edge of the pattern of the phase-changeable material and the first insulating layer.

9. A method according to claim 8 wherein the second insulating layer comprises a material selected from at least one of silicon dioxide ($SiO_2$), silicon nitride ($SiN_x$), silicon oxide nitride (SiON), aluminum oxide ($AlO_x$), titanium oxide ($TiO_2$), tantalum oxide ($Ta_2O_5$), and/or hafnium oxide ($HfO_2$), and/or combinations thereof.

10. A method of forming a phase-changeable memory device comprising:
    forming an insulating layer on a substrate, the insulating layer having a hole therein;
    forming a first electrode in the hole in the insulating layer;
    forming a pattern of a phase-changeable material on the first electrode;
    forming a second electrode on the layer of the phase-changeable material such that the pattern of the phase-changeable material is between the first and second electrodes, wherein portions of the second electrode extend beyond an edge of the pattern of phase-changeable material; and
    wherein a void is defined between the portions of the second electrode extending beyond the edge of the pattern of the phase-changeable material and the first insulating layer.

11. A method according to claim 1 wherein the pattern of the phase-changeable material extends beyond the first electrode onto portions of the first insulating layer outside the hole after forming the second electrode.

12. A method of forming a phase-changeable memory device comprising:
    forming an insulating layer on a substrate, the insulating layer having a hole therein;
    forming a first electrode in the hole in the insulating layer;
    forming a pattern of a phase-changeable material on the first electrode;
    forming a second electrode on the layer of the phase-changeable material such that the pattern of the phase-changeable material is between the first and second electrodes, wherein portions of the second electrode extend beyond an edge of the pattern of phase-changeable material; and
    wherein the first insulating layer is free of the pattern of phase-changeable material.

13. A method according to claim 1 wherein the phase-changeable material comprises a combination including at least one of tellurium (Te) and/or selenium (Se) and at least one of germanium (Ge), antimony (Sb), bismuth (Bi), lead (Pb), tin (Sn), silver (Ag), sulphur (S), silicon (Si), phosphorus (P), oxygen (O), and/or nitrogen (N).

14. A method according to claim 1 wherein each of the first and second electrodes comprises a conductive material including at least one of nitrogen, carbon, titanium, tungsten, molybdenum, tantalum, titanium silicide, tantalum, a silicide, and/or combinations thereof.

15. A method of forming a phase-changeable memory device comprising:
    forming an insulating layer on a substrate, the insulating layer having a hole therein;
    forming a first electrode in the hole in the insulating layer;
    forming a pattern of a phase-changeable material on the first electrode;
    forming a second electrode on the layer of the phase-changeable material such that the pattern of the phase-changeable material is between the first and second electrodes, wherein portions of the second electrode extend beyond an edge of the pattern of phase-changeable material;
    wherein each of the first and second electrodes comprises a conductive material including at least one of nitrogen, carbon, titanium, tungsten, molybdenum, tantalum, titanium silicide, tantalum, a silicide, and/or combinations thereof; and
    wherein each of the first and second electrodes comprises at least one of titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxide nitride (TiON), titanium aluminum oxide nitride (TiAlON), tungsten oxide nitride (WON), and/or tantalum oxide nitride (TaON).

16. A method of forming a phase-changeable memory device comprising:
    forming an insulating layer on a substrate, the insulating layer having a hole therein;
    forming a first electrode in the hole in the insulating layer;
    forming a pattern of a phase-changeable material on the first electrode;
    forming a second electrode on the layer of the phase-changeable material such that the pattern of the phase-changeable material is between the first and second electrodes, wherein portions of the second electrode extend beyond an edge of the pattern of phase-changeable material;
    forming a protective insulating layer on sidewalls of the pattern of phase-changeable material, on exposed surfaces of the second electrode, and on the first insulating layer; and
    forming a second insulating layer on the protective insulating layer so that the protective insulating layer is between the second insulating layer and the second electrode and so that the protective insulating layer is between the second insulating layer and the first insulating layer.

17. A method according to claim 16 wherein forming the protective insulating layer comprises forming the protective insulating layer using at least one of atomic layer deposition and/or thermal chemical vapor deposition.

18. A method according to claim 16 wherein forming the second insulating layer comprises forming the second insulating layer using at least one of plasma vapor deposition and/or plasma enhanced chemical vapor deposition.

19. A method according to claim 16 wherein a void is defined between the portions of the second electrode extending beyond the edge of the phase-changeable material and the first insulating layer.

20. A method according to claim 16 wherein the protective insulating layer comprises a material selected from at least one of silicon dioxide ($SiO_2$), silicon nitride ($SiN_x$), silicon oxide nitride (SiON), aluminum oxide ($AlO_x$), titanium oxide ($TiO_2$), tantalum oxide ($Ta_2O_5$), and/or hafnium oxide ($HfO_2$), and/or a combination thereof.

21. A method according to claim 1 further comprising:
    forming a memory cell transistor in the substrate, the memory cell transistor including spaced apart source/ drain regions and a gate electrode therebetween, wherein the first electrode is electrically coupled with one of the source/drain regions of the memory cell transistor.

22. A method of fabricating a phase-changeable memory device, the method comprising:
   sequentially forming a phase-changeable material layer and an upper electrode layer on a substrate including a lower electrode;
   etching the upper electrode layer using an etch gas including $CF_4$; and
   etching the phase-changeable material layer, while decreasing $CF_4$ as the etching of the phase-changeable material progresses.

23. The method of claim 22, wherein the etch gas further includes Ar and $Cl_2$ gases.

24. A method of fabricating a phase-changeable memory device, comprising:
   sequentially forming a phase-changeable material layer and an upper electrode layer on a substrate including a lower electrode;
   etching the upper electrode layer using a mixture gas of Ar, $Cl_2$ and $CF_4$; and
   etching the phase-changeable material layer, using a mixture gas of Ar and $Cl_2$.

25. A method according to claim 24 wherein etching the phase-changeable material comprises etching the phase-changeable material layer without using $CF_4$.

* * * * *

UNITED STATES PATENT AND TRADEMARK OFFICE
CERTIFICATE OF CORRECTION

PATENT NO.       : 7,037,749 B2
APPLICATION NO.  : 10/780246
DATED            : May 2, 2006
INVENTOR(S)      : Horii et al.

Page 1 of 1

It is certified that error appears in the above-identified patent and that said Letters Patent is hereby corrected as shown below:

On Title Page:

Item (22) Filed: Please correct Filing Date "Feb. 18, 2004"
To read -- Feb. 17, 2004--

Signed and Sealed this

Eighteenth Day of September, 2007

JON W. DUDAS
*Director of the United States Patent and Trademark Office*